(12) United States Patent
Quek et al.

(10) Patent No.: US 8,563,874 B2
(45) Date of Patent: Oct. 22, 2013

(54) ELECTROMAGNETIC INTERFERENCE SHIELDING ARRANGEMENT

(75) Inventors: Pek Chuan Quek, Singapore (SG); Mun Ping Wong, Singapore (SG)

(73) Assignee: Amtek Precision Technology Pte Ltd., Singapore (SG)

( * ) Notice: Subject to any disclaimer, the term of this patent is extended or adjusted under 35 U.S.C. 154(b) by 0 days.

(21) Appl. No.: 13/392,856

(22) PCT Filed: Apr. 20, 2010

(86) PCT No.: PCT/SG2010/000160
§ 371 (c)(1),
(2), (4) Date: Feb. 27, 2012

(87) PCT Pub. No.: WO2011/133108
PCT Pub. Date: Oct. 27, 2011

(65) Prior Publication Data
US 2013/0025928 A1    Jan. 31, 2013

(51) Int. Cl.
*H01R 4/56* (2006.01)
*H05K 9/00* (2006.01)

(52) U.S. Cl.
USPC .......................................... 174/373; 174/384

(58) Field of Classification Search
USPC ................... 174/373, 384; 361/816
See application file for complete search history.

(56) References Cited

U.S. PATENT DOCUMENTS

| | | | | |
|---|---|---|---|---|
| 5,008,487 A | * | 4/1991 | Shimmyo | 174/373 |
| 5,170,321 A | * | 12/1992 | Oslund et al. | 361/722 |
| 5,557,063 A | * | 9/1996 | Mottahed | 174/373 |
| 5,981,871 A | * | 11/1999 | Trumble et al. | 174/388 |
| 6,424,521 B1 | | 7/2002 | Vega et al. | |
| 6,639,145 B1 | * | 10/2003 | Nurmi | 174/387 |
| 6,646,892 B1 | * | 11/2003 | Hsu | 361/818 |
| 6,714,423 B1 | * | 3/2004 | Nurmi | 361/818 |
| 7,202,422 B2 | * | 4/2007 | Ogatsu | 174/373 |
| 2007/0284142 A1 | | 12/2007 | Jonker | |

FOREIGN PATENT DOCUMENTS

WO    WO 01/01742    1/2001

OTHER PUBLICATIONS

International Search Report and Written Opinion dated Jul. 20, 2010 in PCT/SG2010/000160.

* cited by examiner

*Primary Examiner* — Hung Ngo
(74) *Attorney, Agent, or Firm* — Vierra Magen Marcus LLP

(57) ABSTRACT

An electromagnetic interference shielding arrangement comprises a first and a second electro-conductive components that are arranged to be joined. The first electro-conductive component includes a first electro-conductive contact surface. The second electro-conductive component includes a second electro-conductive contact surface and a shielding member extending from the second electro conductive component at a location adjacent the second electro-conductive surface. The arrangement is such that, in the joined configuration of the first and the second electro-conductive components the first and the second electro-conductive surfaces abut to create an electro conductive engagement region that is adjacent the shielding member.

14 Claims, 6 Drawing Sheets

ELECTROMAGNETIC INTERFERENCE SHIELDING ARRANGEMENT

FIELD OF THE INVENTION

The present invention relates generally to shielding enclosures for reducing the electromagnetic interference associated with electronic circuits housed in the enclosures. In particular, the present invention relates to a shielding arrangement for assembling components within such shielding enclosures.

BACKGROUND

It is well known that the operation of electronic circuits is associated with the emission of electromagnetic interference (EMI) in the form of electromagnetic waves. Such EMI may adversely affect the operation of other electronic circuits. To avoid such problems, circuits that are sensitive to EMI or that generate large amount of EMI are usually housed in enclosures with electro-conductive walls. The walls are connected to ground so that any EMI intercepted by the walls, regardless of whether it is coming from within or from outside the enclosure, is sent to ground.

One problem with such arrangements is sealing (in terms of EMI) the joined edges between the walls. Gaps along these joined edges allow external EMI to penetrate (and internally generated EMI to escape the respective enclosure), thus reducing the efficiency of the EMI shield provided by the walls.

Known solutions include the use of conductive EMI gaskets inserted in the joints. The inclusion of such gaskets, however, adds an extra level of complexity and cost. In addition, many gaskets may have an abrasive effect on the conductive surface of the walls to which they are applied.

Other solutions involve the formation of shielding flanges suitably arranged on the periphery of the engaging walls. The reported arrangements, however, appear to have only moderate shielding effect and/or are difficult to manufacture.

SUMMARY

According to one aspect of the present invention, there is provided an electromagnetic interference shielding arrangement comprising a first and a second electro-conductive components that are arranged to be joined. The first electro-conductive component includes a first electro-conductive contact surface. The second electro-conductive component includes a second electro-conductive contact surface and a shielding member extending from the second electro-conductive component at a location adjacent the second electro-conductive surface. The arrangement is such that, in the joined configuration of the first and the second electro-conductive components the first and the second electro-conductive surfaces abut to create an electro-conductive engagement region that is adjacent the shielding member.

Preferably, in the joined configuration, the shielding member is disposed adjacently an entrance edge of the engagement region to shield the entrance edge of the engagement region from outgoing electromagnetic waves.

The shielding member may be spaced apart from a boundary edge of the second electro-conductive component.

The shielding member may comprise a shielding flange.

The first electro-conductive component may comprise a peripheral flange located at the periphery of the first electro-conductive component and comprising the first electro-conductive contact surface.

The shielding member, the peripheral flange, and the first and second contact surfaces may be planar.

The first electro-conductive component may comprise a first planar wall to which the peripheral flange projects perpendicularly and the second electro-conductive component may comprise a second planar wall to which the shielding flange may project perpendicularly.

The boundary edge of the second electro-conductive component may be aligned with the first planar wall of the first component.

The second electro-conductive component may comprise a bend forming a hem, the arrangement being such that a lip of the hem defines the second contact surface and the shielding flange extends from the lip. The bend may define the boundary edge of the second electro-conductive component.

The shielding flange may comprise a first extension portion extending towards the first planar wall of the first electro-conductive component.

The shielding flange may comprise a second extension portion extending from the first extension portion in a direction parallel to the first planar wall of the first electro-conductive component.

The second extension portion may comprise an electro-conductive formation arranged for electro-conductive engagement with an electro-conductive surface of the first planar wall of the first electro-conductive component. The electro-conductive formation may comprise a plurality of dimple fingers or a continuous conductive surface arranged to engage a respective continuous surface of the first component to form a continuous engagement region. The electro-conductive formation may comprise a slot.

Each one of the first electro-conductive component and the second electro-conductive component may comprise one of the following group; a chassis, a wall and a cover.

The arrangement may further comprise fastening means for fastening together the first and the second components, when in the joined configuration.

According to a second aspect of the present invention, there is provided an electromagnetic interference shielding enclosure comprising a plurality of components joined together to form the enclosure, wherein at least two of the components are joined together according to the arrangement of any one of the preceding claims.

According to a third aspect of the present invention, there is provided a method for forming at least a portion of a shielding enclosure, comprising;

providing a first electro-conductive component including a first electro-conductive contact surface;

providing a second electro-conductive component including a second electro-conductive contact surface and a shielding member extending from the second electro-conductive component at a location adjacent the second electro-conductive surface, and configuring the first electro-conductive component and the second electro-conductive component so that, when the first electro-conductive component and the second electro-conductive component are joined to form at least a portion of the enclosure, the first and the second electro-conductive surfaces abut to create an electro-conductive engagement region that is adjacent the shielding member.

Preferably, the method also includes configuring the first electro-conductive component and the second electro-conductive component so that, in the joined configuration, the shielding member is disposed adjacently an entrance edge of the engagement region to shield the entrance edge of the engagement region from outgoing electromagnetic waves.

BRIEF DESCRIPTION OF THE DRAWINGS

Some aspects of at least one embodiment of the present invention will now be described with reference to the drawings, in which.

DETAILED DESCRIPTION

Figure 1A:
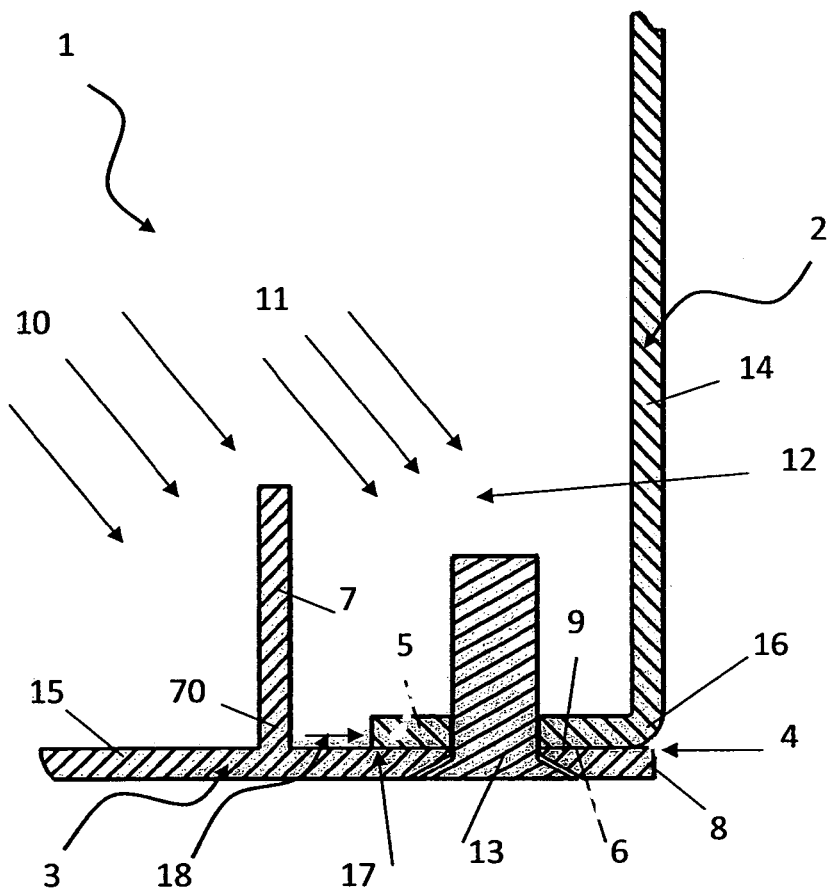
FIGS. 1A and 1B show a cut-away cross-sectional view and a cut-away perspective view, respectively, of an electromagnetic interference shielding arrangement.

Where reference is made in any one or more of the accompanying drawings to features which have the same reference numerals, those features have for the purposes of this description the same function(s) or operation(s), unless the contrary intention appears.

The electromagnetic interference (EMI) shielding arrangement described hereinafter forms a part of an EMI shielding enclosure. However, for the sake of a clear and succinct description of its main features, the EMI shielding arrangement has been described with reference to cut-away representations which do not show the entire enclosure.

Six configurations of the EMI shielding arrangement are described in the following text. Each of these six configurations is described with reference to a respective one of the six sets of enclosed FIGS. 1A, 1B to 6A, 6B. In each of these sets, the A-figure shows a cross-sectional view, while the B-figure shows a perspective view of the respective configuration of the shielding arrangement.

Most of the following description is based on the somewhat more detailed A-figures. The cut-away nature of all the figures and the perspective views of the B-figures are helpful in visualising the shielding arrangement within the context of an electromagnetic shielding enclosure, of which the described shielding arrangement is a part.

FIG. 1A shows a cut-away cross-sectional view of one configuration of the shielding arrangement 1. The shown configuration comprises a first electro-conductive component 2 and a second electro-conductive component 3. Components 2 and 3 are configured to be joined together to form, in their joined configuration (shown in FIG. 1A) an electro-conductive engagement region 4.

The first component 2 comprises a wall 14 and a peripheral flange 5 located at the periphery of the wall 14. The peripheral flange 5 includes a first contact surface 6.

The second component 3 comprises a wall 15 and a shielding member, in the form of a shielding flange 7. The reference to the flange 7 as a shielding flange is related to a shielding function performed by the flange 7, which will be explained later in the text. A boundary edge 8 is defined by the furthermost line of extension of the wall 15 in the direction of the wall 14. The shielding flange 7 and, in particular, the base 70 of the shielding flange 7, is spaced apart from the boundary edge 8. A second contact surface 9 is formed on the second component 3. The second contact surface 9 is adjacent the boundary edge 8 and extends towards the shielding flange 7 of the second component 3. Both the first contact surface 6 and the second contact surface 9 are electro-conductive.

The peripheral flange 5 and the shielding flange 7 are configured so that, when the first component 2 and the second component 3 are joined together in their joined configuration, the first electro-conductive contact surface 6 engages, by way of abutting, the second electro-conductive contact surface 9 to form the electro-conductive engagement region 4 therebetween.

The peripheral flange 5 is formed by way of a bend 16 formed in the wall 14. The angle of the bend 16 is such that the flange 5 is substantially or generally perpendicular to the wall 14. Similarly, the shielding flange 7 is manufactured to also be perpendicular to the wall 15. Such orthogonal arrangements are particularly suitable when the walls 14 and 15 are substantially or generally perpendicular to each other, as shown in FIG. 1A. However, it does not need to be the case and the angle between walls 14 and 15, as well as the angles at which the peripheral flange 5 and the shielding flange 7 extend from the respective wall 14 or 15, may be other than 90°. With respect to the periphery flange 7, it has to be noted that larger angles may increase the amount of electromagnetic radiation 11 which manages to bypass the shielding flange 7 and reach the shielded area 12. On the other hand, angles smaller than 90° may cause shielding flange 7 to interfere with the body of the rivet 13.

As each of the first component 2 or the second component 3 is a portion of a housing wall of an enclosure, the entire first and second components are made of electro-conductive materials and are arranged to be connected to ground. It is the electro-conductive nature of the walls 14 and 15, the shielding flange 7 and the engagement region 4 that allows the shielding arrangement 1 to reduce the propagation of outgoing or incoming electromagnetic waves.

To further improve the shielding effect of the shielding arrangement 1, the components 2 and 3 are so arranged that, in the joined configuration, the shielding flange 7 is disposed adjacently the entrance edge 17 of the engagement region 4. Because of that, the shielding flange 7 shields the entrance edge 17 of the engagement region 4 from outgoing electromagnetic waves 10, as shown in FIG. 1A.

Figure 1B:
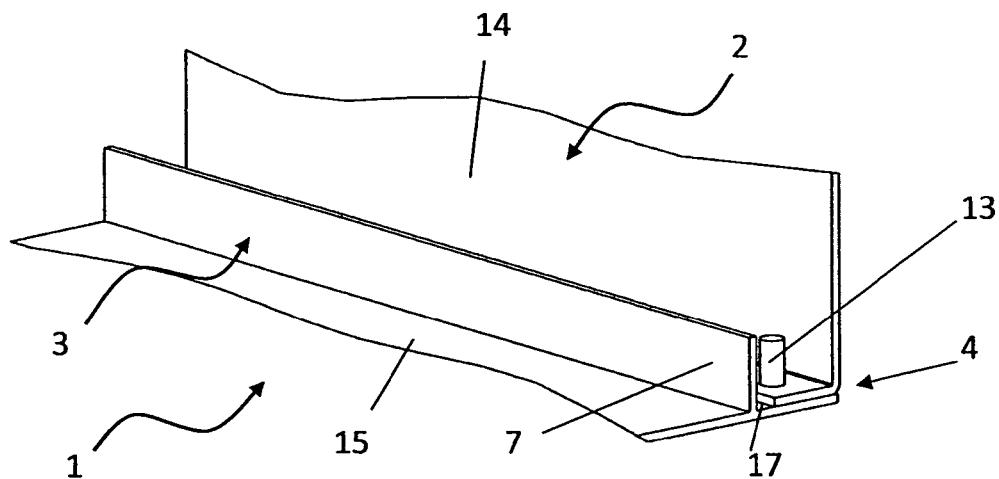

Here it should be noted that the entrance area of the engagement region 4 is notionally referred to as the "entrance edge", in order for the reference to correspond to the single line representation 17 in FIG. 1B. However, due to manufacturing tolerances, the contact surfaces 6 and 9 are usually not perfectly flat. Accordingly, the electro-conductive engagement region 4 will not be a continuous planar surface, but an interstitial space of a complex shape. Points, lines and areas of electro-conductive contact between the contact surfaces 6 and 9 may be scattered throughout this space. The "entrance edge" 17 is thus intended to indicate the entrance area of the engagement region 4, which needs to be crossed by outgoing waves 18 in order to escape through gaps in the engagement region 4. Depending on the evenness of the edge of the peripheral flange 5, the flatness of the contact surfaces 6 and 9 and the fit between the walls 14 and 15, the "entrance edge" 17 may, for example, be in the form of a planar surface or of a surface of a more convoluted shape.

As shown in FIG. 1A, electromagnetic waves 11 are able to travel around the shielding flange 7 and enter the shielded area 12 in the vicinity of the engagement region 4. The electromagnetic waves 11, however, do not have direct access to the entrance edge 17 of the engagement region 4. To be able to approach the entrance edge 17, the electromagnetic waves 11 have to undergo a series of reflections. As a result, only a very small number of electromagnetic waves 11 can reach a position 18 which allows them to cross the entry edge 17 and potentially escape through gaps in the engagement region 4.

In the joined configuration of the component 2 and the component 3, the boundary edge 8 of the second component 3 is substantially or generally aligned with the planar surface of the wall 14 of the first component 2. Here it should be noted that the reference to the boundary edge 8 is based on the fact that the edge 8 is the furthermost line of extension of the wall 15 that defines the wall's boundary with respect to its width (or length).

FIG. 1B is a cut-away perspective view of the configuration of the shielding arrangement 1 shown in FIG. 1A. As shown in FIG. 1A and FIG. 1B, the walls 14 and 15, the first contact surface 6, the second contact surface 9, the peripheral flange 5 and the shielding flange 7 are substantially or generally planar. However, it is envisaged that at lest some of these elements may comprise curved surfaces. It should be noted that the first contact surface 6 and the second contact surface 9 should have shapes that conform to each other in order to form the contact engagement region 4.

FIGS. 1A and 1B also show a fastening means in the form of a rivet 13, used for fastening the first and the second components 2 and 3 together in their joined configuration. Instead of the rivet 13, the fastening means could be in the form of a screw, a bolt etc.

As noted in the above text, the described EMI shielding arrangement 1 of FIGS. 1A and 1B is considered in the context of an enclosure, not shown, for housing one or more electronic elements. Thus, the walls 14 and 15 represent only portions of the respective chassis, side walls or top covers of such an enclosure. Accordingly, the joined configuration of the first component 2 and the second component 3 should be considered as forming a portion (i.e. a joined edge) of such an enclosure.

Figure 2A:
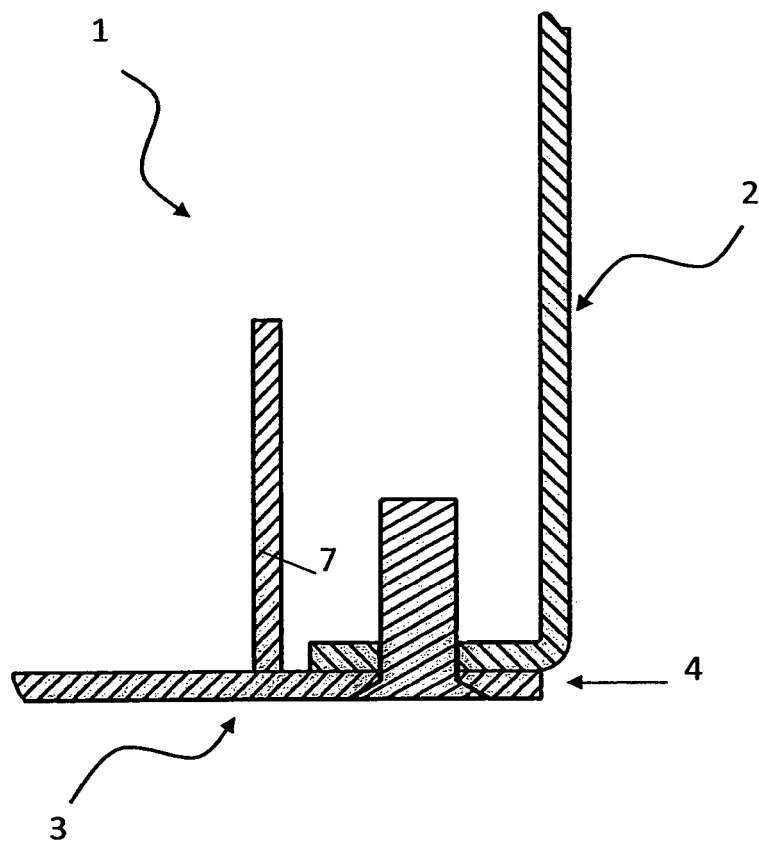
FIGS. 2A and 2B show a cut-away cross-sectional view and a cut-away perspective view, respectively, of a second configuration of the electromagnetic interference shielding arrangement.
Figure 2B:
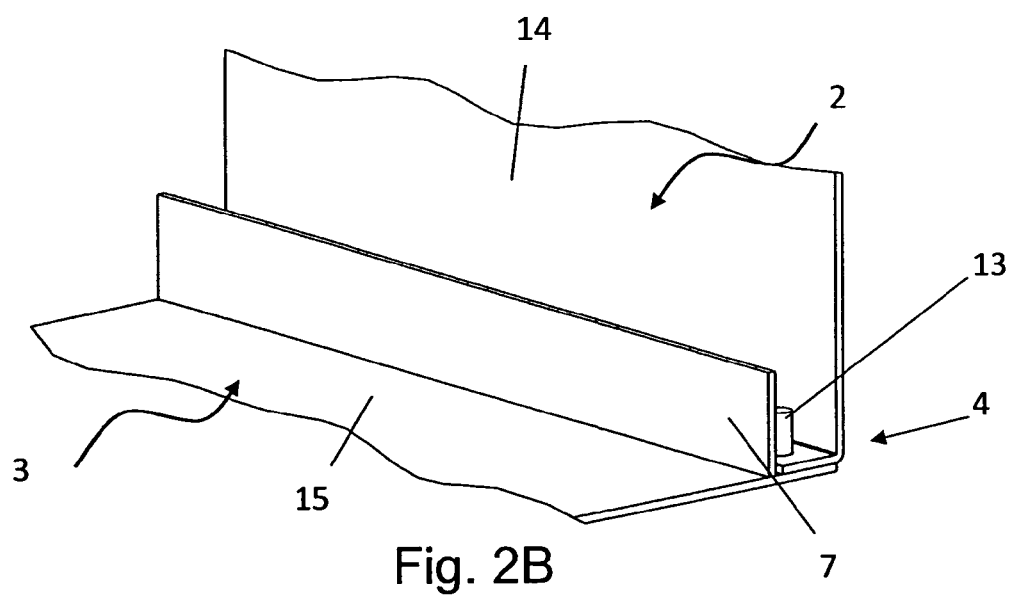

FIGS. 2A and 2B show a cut-away cross-sectional view and a cut-away perspective view, respectively, of a configuration which is very similar to the configuration shown in FIG. 1A. The only difference is in the fact that the shielding flange 7 in FIGS. 2A and 2B is an individual component that is attached to the wall 15 of the second element 3. The attachment itself is effected by way of welding, gluing (using electro-conductive glue) or any other means of attachment which may ensure a substantially or generally continuous electro-conductive engagement between the shielding flange 7 and the wall 15.

Figure 3A:
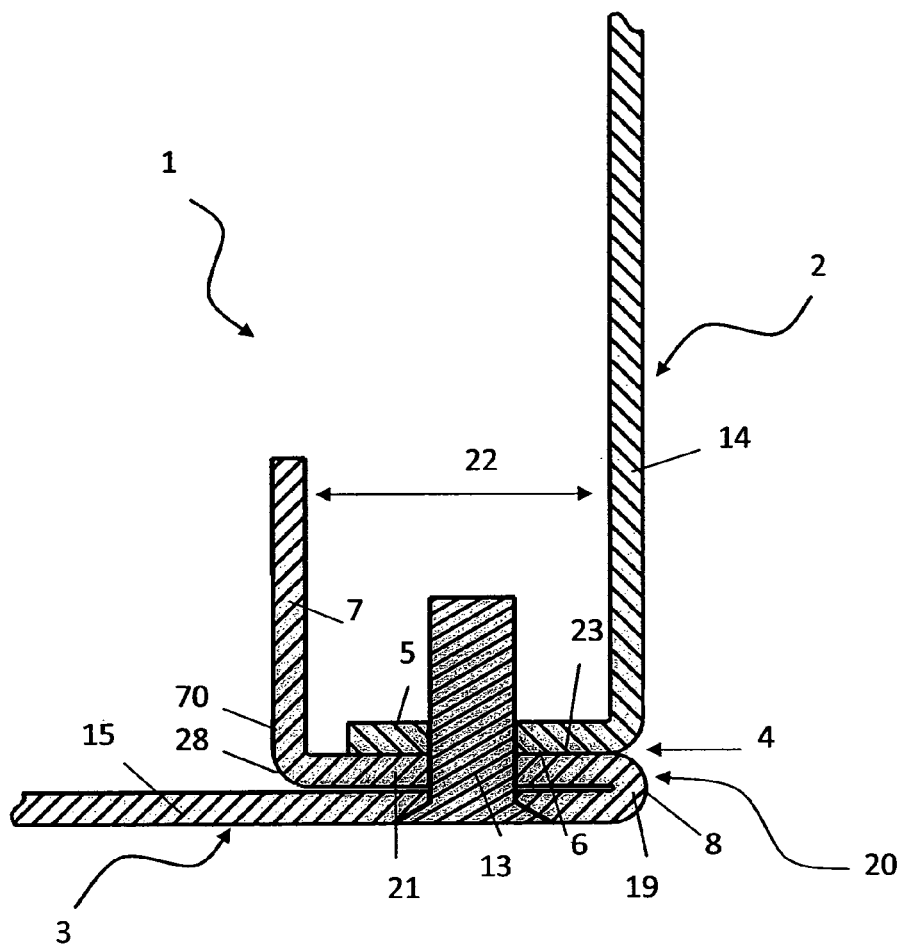
FIGS. 3A and 3B show a cut-away cross-sectional view and a cut-away perspective view, respectively, of a third configuration of the electromagnetic interference shielding arrangement.

FIG. 3A shows a slightly different configuration in which the second component 3 comprises a bend 19 forming a hem 20 comprising a lip 21. The shielding flange 7 in this configuration extends from the lip 21 of the hem 20, after undergoing a 90°-bend 28. Despite the fact that the shielding flange 7 in FIG. 3A is formed from the edge of the sheet forming the wall 15, it does not define the boundary edge of wall 15. Instead, the boundary edge 8 is now defined by the bend 19, as it is this bend 19 that delimits the boundary of the wall 15 with respect to the wall's width (length). The width 22 of the lip 21 defines the space between the boundary edge 8 and the base 70 of the shielding flange 7.

As is the case with FIGS. 1A, 1B and 2A, 2B, the shielding flange 7 is substantially or generally perpendicular to the wall 15 of the component 3. While angles other than 90° may be used for the bend 28, it is noted that larger angles may increase the amount of electromagnetic radiation 11 which manage to bypass the shielding flange 7 and reach the shielded area 12. On the other hand, angles smaller than 90° may cause shielding flange 7 to interfere with the body of the rivet 13.

The first electro-conductive surface 6 is again defined by the periphery flange 5. However, the second electro-conductive contact surface is now defined by the electro-conductive surface 23 of the lip 21. Thus, it is the electro-conductive surface 23 that is engaged in an electro-conductive contact with the first conductive surface 6 of the peripheral flange 5, when the first component 2 and the second component 3 are in an joined configuration.

Figure 3B:
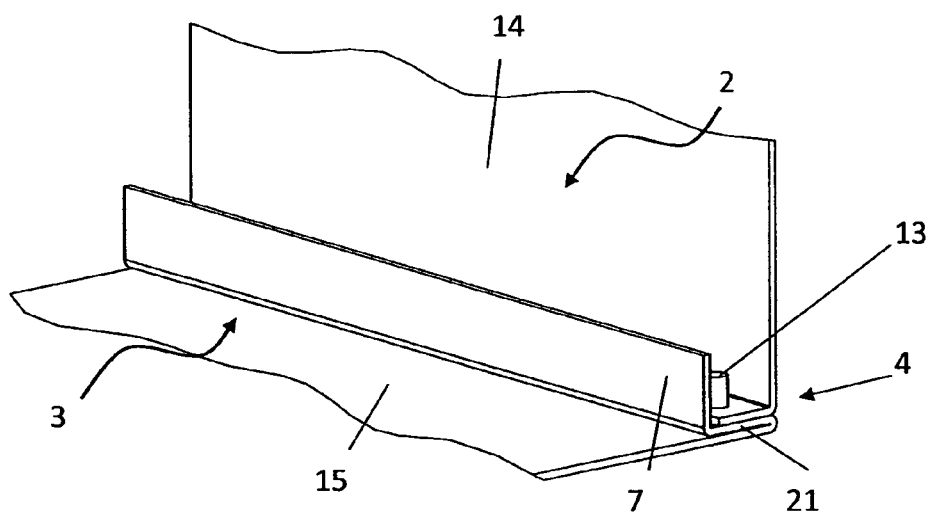

FIG. 3B shows a cut-away perspective view of the configuration of FIG. 3A.

Figure 4A:
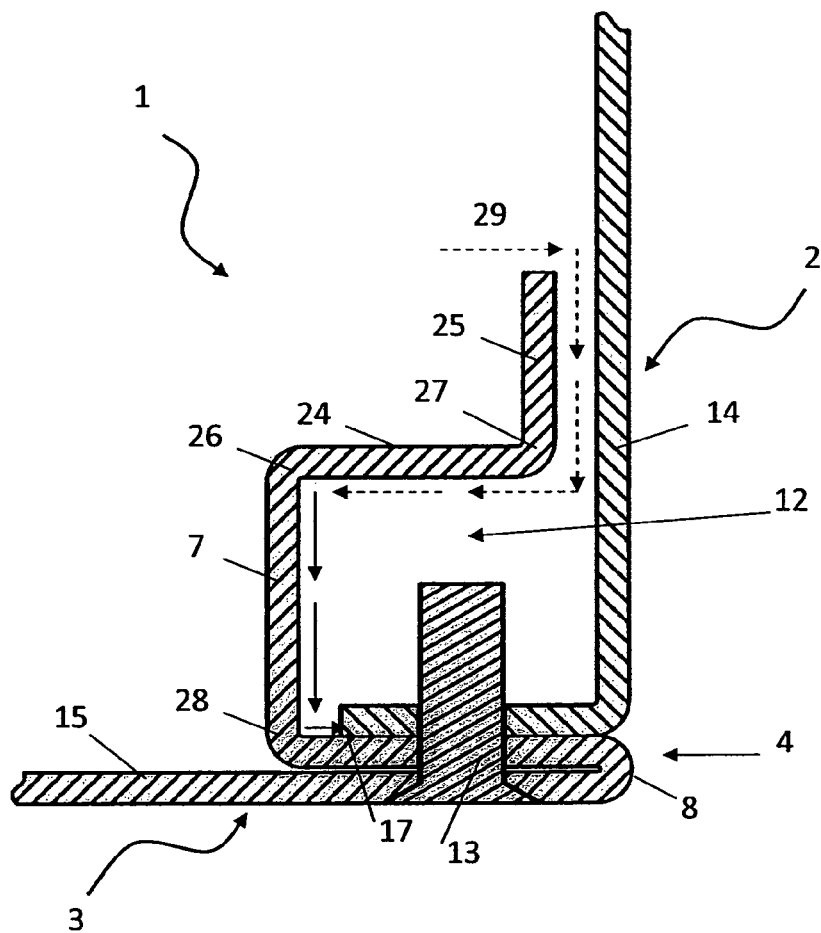
FIGS. 4A and 4B show a cut-away cross-sectional view and a cut-away perspective view, respectively, of a fourth configuration of the electromagnetic interference shielding arrangement.
Figure 4B:
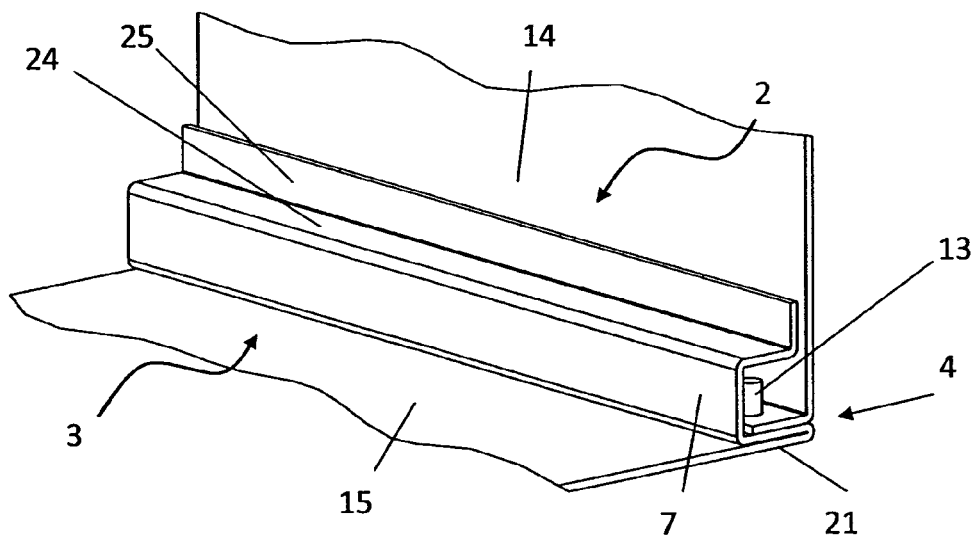

A further configuration of the described shielding arrangement 1 is shown in the cut-away cross-sectional view of FIG. 4A and the cut-away perspective view of FIG. 4B. The only difference from the arrangement shown in FIGS. 3A and 3B relates to the fact that the shielding flange 7 comprises two extension portions 24 and 25.

The inclusion of extension portions 24 and 25 formed by way of the 90°-bends 26 and 27 further limits the amount of electromagnetic waves 11 reaching the shielded area 12, in general, and the entrance edge 17, in particular. The sequence of arrows 29 indicates a sample tortuous path that an outgoing electromagnetic wave needs to undergo in order to access the engagement region 4. A number of arrows 29 are drawn in dotted line. The dotted arrows indicate the contribution to the tortuous path brought about by the inclusion of extension portions 24 and 25 in the structure of the second component 3.

The bends 26 and 27 comprise angles of 90°. As a result, the extension portion 24 extends substantially or generally perpendicularly to both the main body of the shielding flange 7 and the wall 14 of the first component 2, while extension portion 25 is substantially or generally parallel to the wall 14. Even though it is possible to use other angles, it should be noted that the particular angles of the bends 26, 27 and 28 and the lengths of the shielding flange 7 and extension portions 24 and 25, affect the efficiency of the shielding provided to the shielded area 12 and the available space for the rivet 13.

Whilst extension portions 24 and 25 are included in the configuration shown in FIGS. 4A and 4B, an alternative configuration may use only a single extension portion 24, which may still improve the shielding efficiency of the shielding arrangement 1, when compared with the configuration comprising only the shielding flange 7.

Figure 5A:
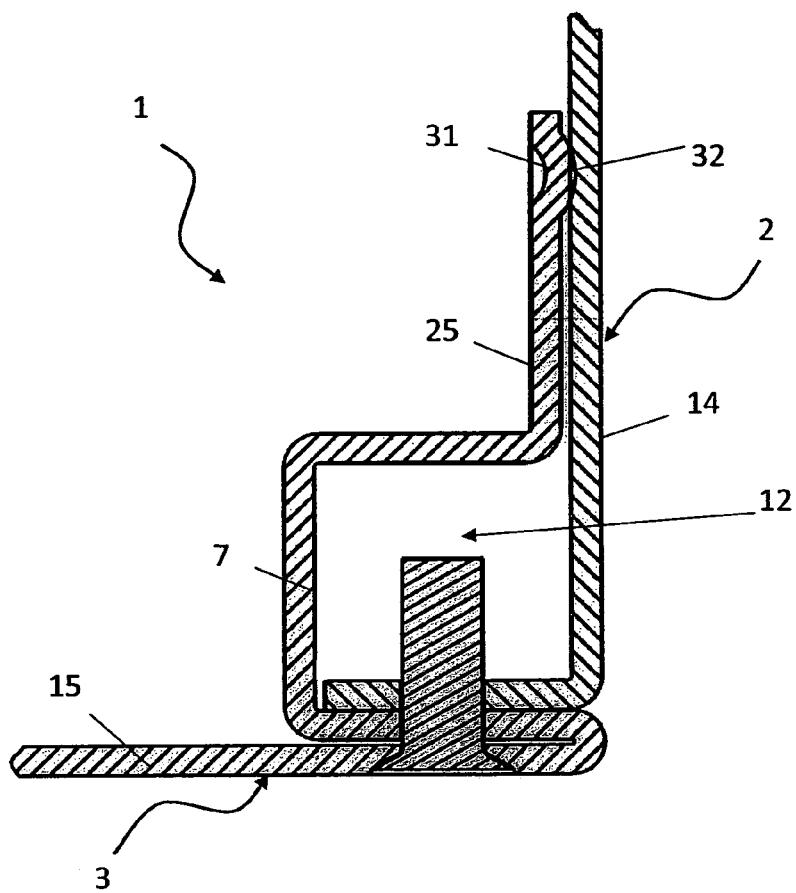
FIGS. 5A and 5B show a cut-away cross-sectional view and a cut-away perspective view, respectively, of a fifth configuration of the electromagnetic interference shielding arrangement.

FIG. 5A shows a cut-away cross-sectional view of a configuration of the shielding arrangement, in which the flange 25 comprises an electro-conductive formation in the form of a plurality of dimpled fingers 31. A surface 32 of each of the fingers 31 is arranged for electro-conductive engagement with the electro-conductive wall 14 of the first component 2. The electro-conductive engagement effected by the fingers 31 improves the efficiency of the shielding arrangement 1.

Figure 5B:
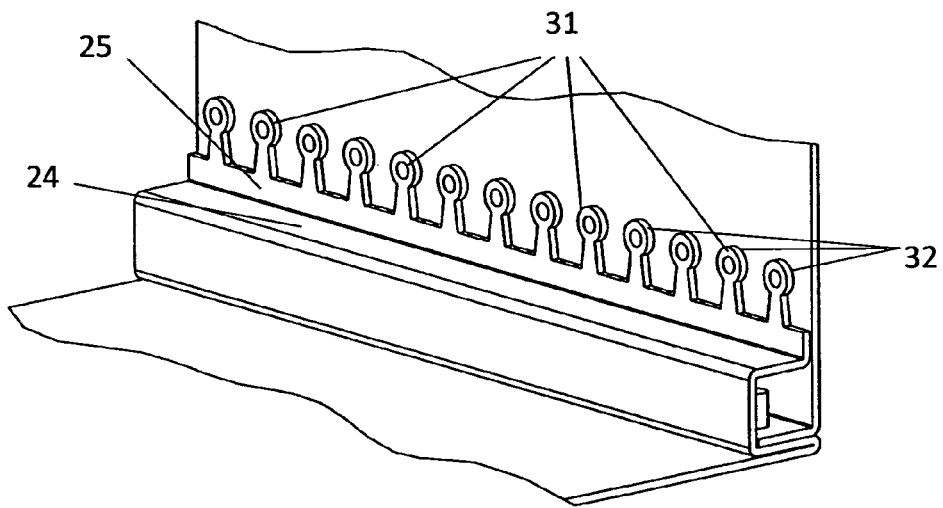

FIG. 5B shows the cut-away perspective view of the configuration shown in FIG. 5A. As seen in FIG. 5B, the shielding provided by the electro-conductive dimpling fingers 31 is not complete, as the contact surfaces 32 of the dimpled fingers 31 do not form a continuous electro-conductive surface.

Figure 6A:
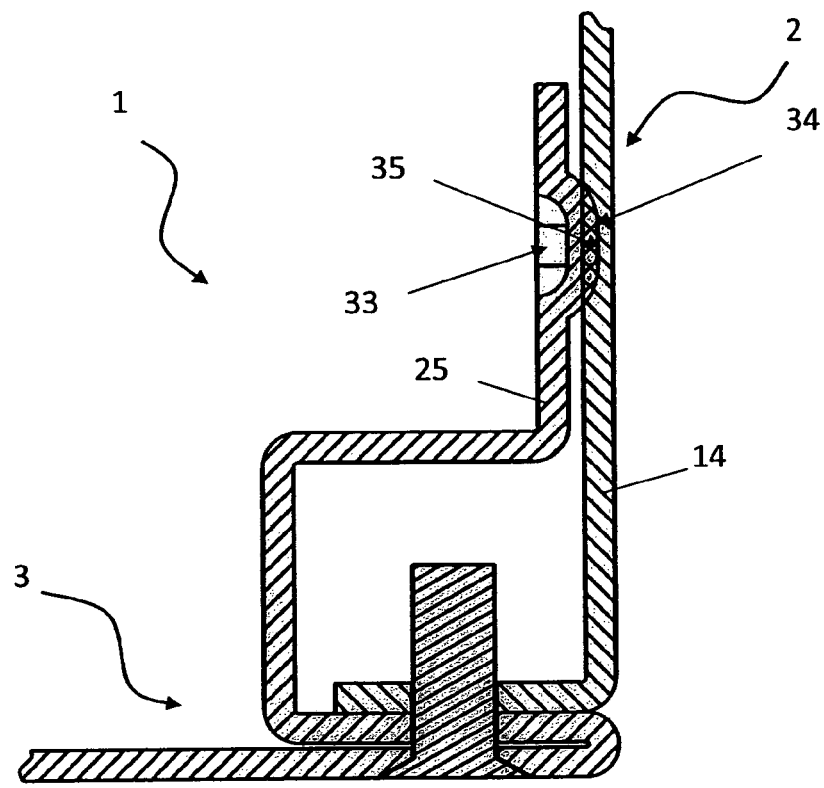
FIGS. 6A and 6B show a cut-away cross-sectional view and a cut-away perspective view, respectively, of a sixth configuration of the electromagnetic interference shielding arrangement.
Figure 6B:
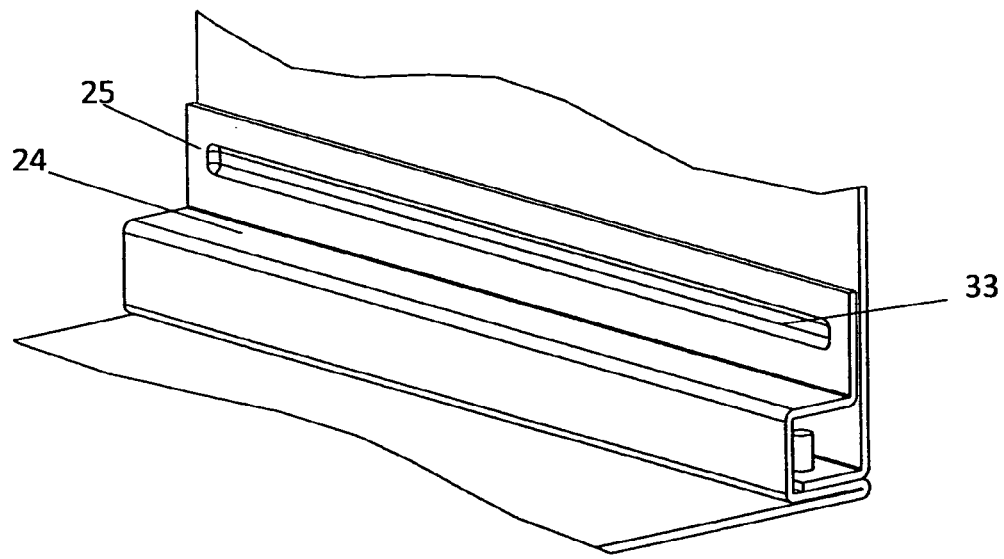

FIG. 6A shows a cut-away cross-sectional view of yet another configuration of the shielding arrangement. FIG. 6B shows a cut-away perspective view of the configuration of FIG. 6A. In this configuration the electro-conductive formation of the flange 25 is in the form of an electro-conductive slot 33. The electro-conductive slot 33 comprises a substantially or generally continuous electro-conductive contact surface 34 configured to form a substantially or generally continuous electro-conductive contact with a respective continuous electro-conductive surface 35 of the wall 14. The contact surface 34 is of a spherical or semi-spherical shape. The corresponding contact surface 35 is formed by the inner surface of a groove or other indentation formed in the wall 14. Other arrangements in which, for example, the contact surface 34 may be flat and engage the surface of a non-deformed wall 14, are also possible.

Every element shown in the hereinbefore described configurations is made of electro-conductive materials. While some of the surfaces of the walls 14 and 15 of the components 2 and 3 may be painted by a non-conductive paint, this is not the case with the surfaces 6 and 9, 32, 34 and 35. The conductivity of these surfaces is important for providing a good contact across the respective engagement regions in order to maintain the shielding efficiency of the discussed shielding arrangement.

It has to be noted that the configurations of the electromagnetic shielding arrangement shown in FIGS. 3A, 3B to 6A, 6B can be manufactured by using an extruded sheet of metal. Such a manufacturing process, involving an extruded sheet of metal and using hems and bends for forming the shielding flange 7 and the extension portions 24 and 25, is generally easier to design and automate. This is one additional advantage associated with the configuration shown in FIGS. 3A, 3B to 6A, 6B when compared with previous arrangements.

The foregoing text describes only some embodiments of the present invention, and modifications and/or changes can be made thereto without departing from the scope and spirit of the invention, the embodiments being illustrative and not restrictive.

For example, the above description has been presented in terms of an EMI shielding arrangement between two components forming a part of an EMI shielding enclosure for housing one or more electronic elements. Accordingly, such an enclosure comprising at least two components joined together according to the above-described arrangement is also within the scope of the above description.

In addition, whilst the shielding arrangement has been described with respect to its affect on outgoing EMI originating from the respective enclosure, similar consideration are applicable to any incoming EMI. Such incoming EMI can enter the shielding enclosure through a gap in the engagement region 4 and by following a path opposite to the path marked by arrows 29.

The claims defining the invention are as follows:

1. An electromagnetic interference shielding arrangement comprising a first and a second electro-conductive components arranged to be joined, wherein:

the first electro-conductive component comprises a first wall and a peripheral flange located at the periphery of the first wall and which projects perpendicularly from the first wall, and a first electro-conductive contact surface on the peripheral flange; and the second electro-conductive component comprises a second wall having a boundary edge, a second electro-conductive contact surface and a shielding member extending from the second wall at a location adjacent the second electro-conductive surface and projecting perpendicularly to the second wall and separated from the boundary edge by the second electro-conductive contact surface;

the arrangement being such that, in the joined configuration of the first and the second electro-conductive components the boundary edge of the second wall of the second electro-conductive component is aligned with the first wall of the first component, the first and the second electro-conductive surfaces abut to create an electro-conductive engagement region that is adjacent the shielding member and the shielding member is disposed adjacently an entrance edge of the engagement region to shield the entrance edge of the engagement region from outgoing electromagnetic waves, the electro-conductive engagement region providing electrical connection between the first and the second electro-conductive components.

2. The shielding arrangement of claim 1 wherein the shielding member, the peripheral flange, and the first and second contact surfaces are planar.

3. The shielding arrangement of claim 2, wherein the second electro-conductive component comprises a bend forming a hem, the arrangement being such that a lip of the hem defines the second contact surface and the shielding flange extends from the lip.

4. The shielding arrangement of claim 3, wherein the bend defines the boundary edge of the second electro-conductive component.

5. The shielding arrangement of claim 3, wherein the shielding flange comprises a first extension portion extending towards the first planar wall of the first electro-conductive component.

6. The shielding arrangement of claim 5 wherein the shielding flange comprises a second extension portion extending from the first extension portion in a direction parallel to the first planar wall of the first electro-conductive component.

7. The shielding arrangement of claim 6, wherein the second extension portion comprises an electro-conductive formation arranged for electro-conductive engagement with an electro-conductive surface of the first planar wall of the first electro-conductive component.

8. The shielding arrangement of claim 7, wherein the electro-conductive formation comprises a plurality of dimple fingers.

9. The shielding arrangement of claim 7, wherein the electro-conductive formation comprises a continuous conductive surface arranged to engage a respective continuous surface of the first component to form a continuous engagement region.

10. The shielding arrangement of claim 9, wherein the electro-conductive formation comprises a slot.

11. The shielding arrangement of claim 1, wherein each one of the first electro-conductive component and the second electro-conductive component comprises one of the following: a chassis, a wall and a cover.

12. The shielding arrangement of claim 1, wherein the arrangement further comprises fastening means for fastening together the first and the second components, when in the joined configuration.

13. An electromagnetic interference shielding enclosure comprising:

a plurality of components joined together to form the enclosure;

wherein the plurality of components include at least first and second electro-conductive components arranged to be joined;

wherein the first electro-conductive component comprises a first wall and a peripheral flange located at the periphery of the first wall and which projects perpendicularly from the first wall, and a first electro-conductive contact surface on the peripheral flange;

wherein the second electro-conductive component comprises a second wall having a boundary edge, a second electro-conductive contact surface and a shielding member extending from the second wall at a location adjacent the second electro-conductive surface and projecting perpendicularly to the second wall and separated from the boundary edge by the second electro-conductive contact surface; and wherein in the joined configuration of the first and the second electro-conductive components the boundary edge of the second wall of the second electro-conductive component is aligned with the first wall of the first component, the first and the second electro-conductive surfaces abut to create an electro-conductive engagement region that is adjacent the shielding member and the shielding member is disposed adjacently an entrance edge of the engagement region to shield the entrance edge of the engagement region from outgoing electromagnetic waves, the electro-conductive engagement region providing electrical connection between the first and the second electro-conductive components.

14. A method for forming at least a portion of a shielding enclosure, comprising:

providing a first electro-conductive component comprising a first wall and a peripheral flange located at the periphery of the first wall and which projects perpendicularly from the first wall, and including a first electro-conductive contact surface on the peripheral flange;

providing a second electro-conductive component comprising a second wall having a boundary edge, a second electro-conductive contact surface and a shielding member extending from the second wall at a location adjacent the second electro-conductive surface, and projecting perpendicularly to the second wall and separated from the boundary edge by the second electro-conductive contact surface; and configuring the first electro-conductive component and the second electro-conductive component so that, when the first electro-conductive component and the second electro-conductive component are joined to form at least a portion of the enclosure, the boundary edge of the second electro-conductive component is aligned with the first wall of the first component, the first and the second electro-conductive surfaces abut to create an electro-conductive engagement region that is adjacent the shielding member and the shielding member is disposed adjacently an entrance edge of the engagement region to shield the entrance edge of the engagement region from outgoing electromagnetic waves, the electro-conductive engagement region providing electrical connection between the first and the second electro-conductive components.

\* \* \* \* \*